United States Patent [19]

Guyette

[11] 4,037,898
[45] July 26, 1977

[54] SNAP-IN ELECTRICAL TERMINALS

[75] Inventor: Edward L. Guyette, Costa Mesa, Calif.

[73] Assignee: Beckman Instruments, Inc., Fullerton, Calif.

[21] Appl. No.: 283,985

[22] Filed: Aug. 28, 1972

[51] Int. Cl.² .................................... H05K 1/02
[52] U.S. Cl. ........................ 339/17 C; 339/217 S
[58] Field of Search ............ 339/17, 14, 95 R, 95 D, 339/125, 126, 128, 220, 221, 219, 256, 252

[56] References Cited

U.S. PATENT DOCUMENTS

| 3,107,965 | 10/1963 | Solorow et al. | 339/217 S |
| 3,201,532 | 8/1965 | Grundig | 339/128 X |
| 3,340,497 | 9/1967 | Balint | 339/217 R |
| 3,344,388 | 9/1967 | Parker et al. | 339/17 D |
| 3,492,628 | 1/1970 | Matthews | 339/17 C |
| 3,535,673 | 10/1970 | Maltais et al. | 339/14 R X |
| 3,536,821 | 10/1970 | Doering, Jr. | 339/219 R X |
| 3,611,249 | 10/1971 | Lovrenich | 339/17 R |

FOREIGN PATENT DOCUMENTS

| 1,311,625 | 10/1962 | France | 339/217 S |
| 6,402,914 | 9/1965 | Netherlands | 339/17 R |
| 1,086,414 | 10/1967 | United Kingdom | 339/17 C |

Primary Examiner—Ramon S. Britts
Assistant Examiner—Terrell P. Lewis
Attorney, Agent, or Firm—R. J. Steinmeyer; F. L. Mehlhoff; W. H. May

[57] ABSTRACT

This invention provides a snap-in terminal for electrical connection between an external conductor and a conductive film deposited on a nonconductive substrate. The terminal is stamped from a flat sheet of resilient conductive material and comprises a center position having a forward extension to which the external conductor may be attached and a rearward extension curved downward for establishing electrical contact with the film on the substrate, and a plurality of legs extending outward from the center portion and bent about 90° downward from the center portion, each leg having at its terminus a tab. The terminal is installed by inserting the legs into a slot in the substrate contiguous with the film. The tabs deflect to fit within the restricted space of the slot and then recover their original position as they emerge from the slot at the bottom of the substrate, thereby securing the terminal to the substrate.

5 Claims, 12 Drawing Figures

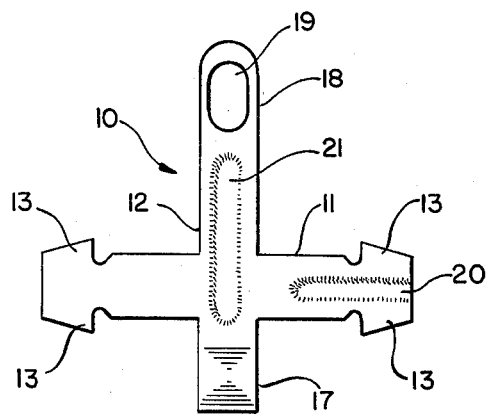
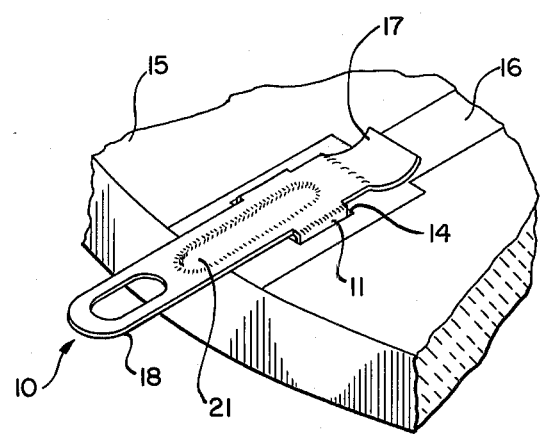
FIG. 1  FIG. 2
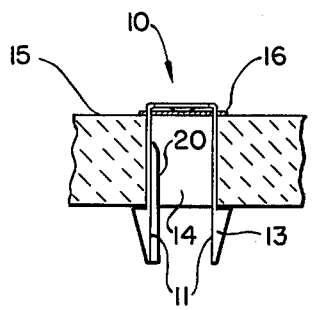
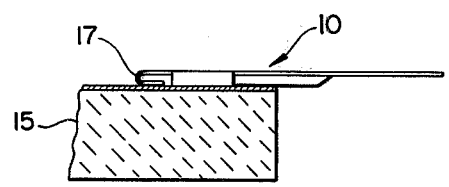
FIG. 3  FIG. 4
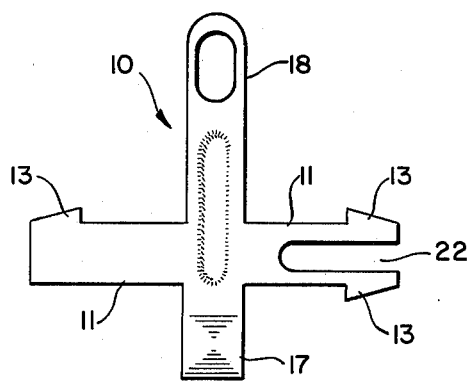
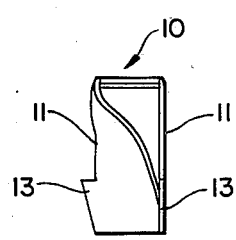
FIG. 5  FIG. 6

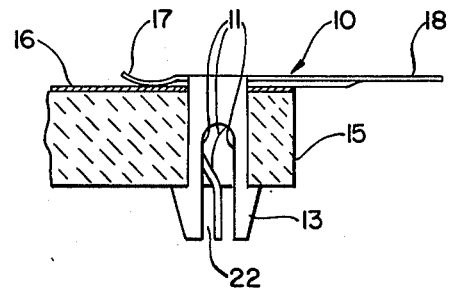
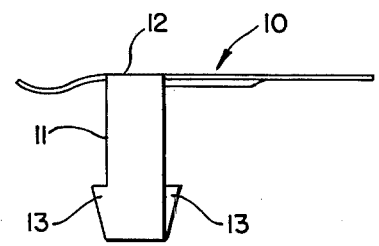
FIG. 7     FIG. 8
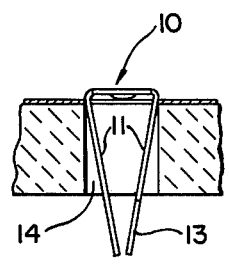
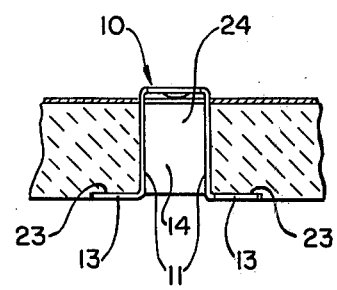
FIG. 9     FIG. 10
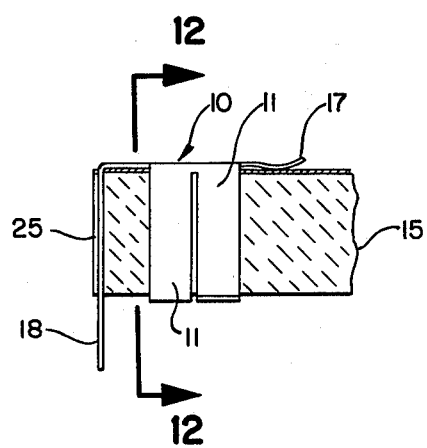
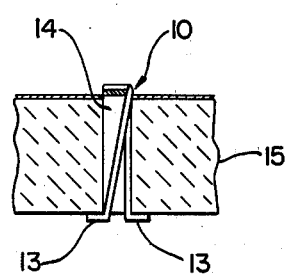
FIG. 11     FIG. 12

SNAP-IN ELECTRICAL TERMINALS

BACKGROUND OF THE INVENTION

A method of forming an electrical circuit comprises supporting electrical components on a flat surface of a nonconductive substrate and electrically connecting the components by means of a network of electrically conductive film deposited on the surface. In order to connect the circuit to an external conductor leading to a source of power or other electrical apparatus, a terminal is provided. One such terminal, described in U.S. Pat. No. 3,536,821 to Doering and assigned to the same assignee as the present application, utilizes a rivet or other compression clamping means for securing the terminal to the substrate. One drawback of such a terminal is that a rivet and means for securing the rivet are required in addition to the terminal itself. It is an object of this invention to provide a terminal which is easily fabricated and installed.

SUMMARY OF THE INVENTION

This invention provides a terminal for providing electrical connection between an external conductor and a conductive film deposited on a nonconductive substrate. The terminal is fabricated from a single, flat sheet of resilient, conductivematerial and comprises a center portion having a forward extension to which the external conductor may be attached and a rearward extension curved downwardly for establishing electrical contact with the film on the substrate, and a plurality of legs extending outwardly from the center portion and bent about 90° downwardly from the center portion, each leg having at its terminus a tab. As the legs are inserted into a slot in the substrate, the tabs guide the legs into the slot and then snap out and lock in place under the substrate, thereby securing the terminal to the substrate. Each tab is desirably pointed at its tip and shaped like a barb to facilitate insertion and locking of the terminal. A shoulder of the slot is contiguous with the film so that the rearward extension of the center portion is in electrical contact with the film. The forward extension is available for connection with the external conductor. Preferably the forward extension extends beyond the edge of the substrate.

BRIEF DESCRIPTION OF THE DRAWINGS

FIG. 1 is a top view of a terminal stamped from a sheet of resilient, conductive material.

FIG. 2 is a perspective view of the terminal of FIG. 1 installed on a substrate. FIG. 3 is a front view of the installed terminal of FIG. 2, with the substrate shown in section.

FIG. 4 is a side view of a terminal installed on a substrate.

FIG. 5 is a top view of a terminal stamped from a resilient, conductive material.

FIG. 6 is a side view of the terminal of FIG. 5 shaped for installation.

FIG. 7 is a side view of the terminal of FIGS. 5 and 6 installed on a substrate, with the substrate shown in section.

FIG. 8 is a side view of a terminal.

FIG. 9 is a front view of the terminal of FIG. 8 during installation on a substrate.

FIG. 10 is a front view of a terminal installed on a substrate, with the substrate shown in section.

FIG. 11 is a side view of a terminal installed on a substrate, with the substrate shown in section.

FIG. 12 is a sectional view of the installed terminal of FIG. 11.

DETAILED DESCRIPTION

FIG. 1 shows a terminal 10 as it appears immediately after being stamped from a sheet of resilient, conductive material. The terminal 10 has two legs 11 extending from a center portion 12. Each leg 11 has two tabs 13 which serve to retain the terminal 10 on a substrate. Prior to installation of the terminal 10 on a substrate, the legs 11 are bent downward substantially 90° so that they are approximately parallel with each other; and the four tabs 13 are bent outward substantially 90° with respect to the legs 11. As shown in FIG. 2, the terminal 10 is installed by inserting the legs 11 into a slot 14 in a substrate 15, a shoulder of the slot 14 being contiguous with a conductive film 16 deposited on the substrate 15. The terminal 10 has a rearward extension 17 which is curved downward for establishing electrical contact with the film 16. The terminal 10 also has a forward extension 18 to which an external conductor may be connected. To facilitate connection between the terminal 10 and the conductor, a hole 19 or other means, such as a tee (not shown), is provided at the end of the forward extension 18.

To facilitate insertion of the legs 11 into the slot 14, a recess 20 is formed on one of the legs 11 extending from its lower edge along its longitudinal axis. The recess 20 enables the tabs 13 to rotate or deflect slightly as the legs 11 are inserted into the slot 14.

A recess 21 is formed in the center portion 12 to serve several functions. Its main function is to compensate for variations in substrate thickness and terminal dimensions to ensure that the terminal 10 fits snugly into the slot 14. By applying pressure to the edges of the center portion 12, the effective length of the legs 11 can be adjusted through the flexing action produced by the pressure. The recess 21 also serves as a secondary point of electrical connection between the terminal 10 and the film 16 since the underside of the recess 21 is in contact with the film 16 when the terminal 10 is installed on the substrate 15.

FIG. 4 illustrates another embodiment of the rearward extension 17. In FIG. 4 the terminal portion of the rearward extension 17 is curled under the remainder of the rearward extension 17 to establish electrical connection between the terminal 10 and the film 16.

FIGS. 5, 6 and 7 illustrate a terminal 10 having three legs 11 for securing the terminal 10 to a substrate. The forward extension 18 and rearward extension 19 are the same as described in connection with FIGS. 1-3. Each of the legs 11 has a tab 13 and is bent downward for installation. Two of the three legs 11 are on the same side and have a gap 22 between them. The lower edge of the leg 11 on the opposite side is twisted about 90° prior to installation of the terminal into the slot 14. When the leg 11 is twisted, its tab 13 extends away from the other two legs 11 and the opposite lower corner of the twisted leg 11 fits between the gap 22 between the other two legs 11. When the tabs 13 emerge from the bottom of the slot 14, they snap out, thereby securing the terminal 10 to the substrate 15.

FIGS. 8 and 9 illustrate a terminal 10 having two legs 11 extending from opposite sides of the center portion 12. Each leg 11 has a single tab 13 in the same plane as the leg. The tabs 13 extend outwardly and in opposite directions. The legs 11 deflect as they are inserted into a slot 14; and when the legs 11 are fully inserted, the tabs 13 snap into place to secure the terminal 10 to the substrate 15. An advantage of the terminal of FIGS. 8 and 9 is that it is more rigid when installed compared to terminals of the other figures due to the force of the legs 11 acting against the ends of the slot 14.

FIG. 10 illustrates a terminal 10 having two legs 11, each of which has a tab 13 formed by bending a terminal portion of each leg 11 outward about 90°. Recesses 23 are provided in the bottom of the substrate to accommodate the tabs 13 so that the tabs do not extend beyond the bottom of the substrate. After the terminal is installed, solder or a synthetic resin 24 may be dropped into the slot 14 to further secure the terminal 10 in the slot 14.

FIGS. 11 and 12 illustrate a terminal 10 having two legs 11, both of which are on the same side. Each leg 11 has a tab 13 formed as described in connection with FIG. 10. An advantage of the terminal of FIGS. 11 and 12 is that it can be inserted into a relatively narrow slot 14. FIG. 11 also shows the forward extension 18 bent downward and placed in a channel 25 in the edge of the substrate 15.

What is claimed is:

1. A terminal for providing electrical connection between an external conductor and a conductive film deposited on a nonconductive substrate, the terminal being fabricated from a single, flat sheet of resilient, conductive material and comprising:

a center portion having a forward extension to which the external conductor may be attached and a rearward extension curved downwardly into electrical contact with the film on the substrate; said center portion being formed with a recess having an underside which is in contact with the film when the terminal is installed on a substrate; and a plurality of legs extending from the center portion and bent downward substantial 90° from the center portion, each leg having at its terminus a tab, with the legs inserted into a corresponding slot in the substrate, so that the tabs guide the legs into the slot and then snap out and lock in place as they emerge from the slot at the bottom of the substrate, thereby securing the terminal to the substrate, wherein said plurality of legs comprises two legs extending from opposite sides of the center portion, one of the legs having a recess extending from its lower edge along its longitudinal axis.

2. The terminal for providing electrical connection between an external conductor and a conductive film deposited on a nonconductive substrate, the terminal being fabricated from a single, flat sheet of resilient, conductive material and comprising:

a center portion having a forward extension to which the external conductor may be attached and a rearward extension curved downwardly into electrical contact with the film on the substrate; said center portion being formed with a recess havingan underside which is in contact with the film when the terminal is installed on a substrate; and a plurality of legs extending from the center portion and bent downward substantially 90° from the center portion, each leg having at its terminus a tab, with the legs inserted into a corresponding slot in the substrate, so that the tabs guide the legs into the slot and then snap out and lock in place as they emerge from the slot at the bottom of the substrate, thereby securing the terminal to the substrate, wherein said plurality of legs comprises three legs, two legs being on one side of the center portion and the third leg being on the other side with a space between the two legs on the same side such that the third leg may be twisted 90° and have a portion of one of its edges in the space between the other two legs whereby when the terminal is installed on a substrate the third leg remains twisted in position with its tab extending away from the other two legs.

3. The terminal for providing electrical connection between an external conductor and a conductive film deposited on a nonconductive substrate, the terminal being fabricated from a single, flat sheet of resilient, conductive material and comprising:

a center portion having a forward extension to which the external conductor may be attached and a rearward extension curved downwardly into electrical contact with the film on the substrate; and a plurality of legs extending from the center portion and bent downward substantially 90° from the center portion each leg having at its terminus a tab, with the legs inserted into a corresponding slot in the substrate, so that the tabs guide the legs into the slot and then snap out and lock in place as they emerge from the slot at the bottom of the substrate, thereby securing the terminal to the substrate, each of said tabs being pointed at its tip and shaped like a barb, wherein said plurality of legs comprises two legs extending from opposite sides of the center portion, each leg having a single tab in the same plane as the leg, the tabs extending outwardly and in opposite directions.

4. The terminal for providing electrical connection between an external conductor and a conductive film deposited on a nonconductive substrate, the terminal being fabricated from a single, flat sheet of resilient, conductive material and comprising:

a center portion having a forward extension to which the external conductor may be attached and a rearward extension curved downwardly into electrical contact with the film on the substrate; said center portion being formed with a recess having an underside which is in contact with the film when the terminal is installed on a substrate; and a plurality of legs extending from the center portion and bent downward substantially 90° from the center portion each leg having at its terminus a tab, with the legs inserted into a corresponding slot in the substrate, so that the tabs guide the legs into the slot and then snap out and lock in place as they emerge from the slot at the bottom of the substrate, thereby securing the terminal to the substrate, wherein said plurality of legs comprises two legs, both legs extending from the same side of the center portion, and each tab being formed by bending a terminal portion of each leg about 90°.

5. A terminal for providing electrical connection between an external conductor and a conductive film deposited on a nonconductive substrate, the terminal being fabricated from a single, flat sheet of resilient, conductive material and comprising:

a center portion having a forward extension to which the external conductor may be attached and a rearward extension curved downwardly into electrical contact with the film on the substrate;

a plurality of legs extending from the center portion and bent downward substantially 90° from the center portion, each leg having at its terminus a tab, with the legs inserted into a corresponding slot in the substrate, so that the tabs guide the legs into the slot and then snap out and lock in place as they emerge from the slot at the bottom of the substrate, thereby securing the terminal to the substrate;

a nonconductive substrate supporting a conductive film thereon, the substrate having a slot having a shoulder contiguous with the film, the terminal being installed in the slot with the rearward extension in electrical contact with the film, the forward extension of said terminal extending beyond an edge of the substrate.

* * * * *